(12) United States Patent
Kamata et al.

(10) Patent No.: US 12,534,591 B2
(45) Date of Patent: Jan. 27, 2026

(54) LOW-VOLTAGE VARISTOR, CIRCUIT BOARD, SEMICONDUCTOR COMPONENT PACKAGE, AND INTERPOSER

(71) Applicant: NAMICS CORPORATION, Niigata (JP)

(72) Inventors: Yoshitaka Kamata, Niigata (JP); Toshiyuki Sato, Niigata (JP)

(73) Assignee: NAMICS CORPORATION, Niigata (JP)

( * ) Notice: Subject to any disclaimer, the term of this patent is extended or adjusted under 35 U.S.C. 154(b) by 681 days.

(21) Appl. No.: 17/908,820

(22) PCT Filed: Mar. 1, 2021

(86) PCT No.: PCT/JP2021/007631
§ 371 (c)(1),
(2) Date: Sep. 1, 2022

(87) PCT Pub. No.: WO2021/177207
PCT Pub. Date: Sep. 10, 2021

(65) Prior Publication Data
US 2023/0139930 A1    May 4, 2023

(30) Foreign Application Priority Data
Mar. 2, 2020    (JP) .................... 2020-035271

(51) Int. Cl.
*C08K 3/04*    (2006.01)
*H01C 7/10*    (2006.01)
(Continued)

(52) U.S. Cl.
CPC ............... *C08K 3/041* (2017.05); *H01C 7/10* (2013.01); *H01L 23/62* (2013.01); *H01L 23/66* (2013.01);
(Continued)

(58) Field of Classification Search
CPC . C08K 3/041; C08K 3/04; C08K 7/24; H01C 7/10; H01C 7/1006; H01C 17/0652;
(Continued)

(56) References Cited

U.S. PATENT DOCUMENTS 5,171,774 A    12/1992   Ueno et al.
5,416,462 A    5/1995    Demarmels et al.
(Continued)

FOREIGN PATENT DOCUMENTS

JP    H02145659 A    6/1990
JP    H06215903 A    8/1994
(Continued)

OTHER PUBLICATIONS

Chinese Office Action (and an English language translation thereof) dated Mar. 14, 2024, issued in counterpart Chinese Application No. 202180010589.1.
(Continued)

*Primary Examiner* — Doris L Lee
(74) *Attorney, Agent, or Firm* — Holtz, Holtz & Volek PC

(57) ABSTRACT

A low-voltage varistor includes a cured body of a resin composition for forming the low-voltage varistor. The resin composition includes: (A) at least one selected from carbon nanotubes and carbon aerogels; and (B) at least one selected from epoxy resin and acrylic resin.

15 Claims, 7 Drawing Sheets

(51) Int. Cl.
  *H01L 23/62* (2006.01)
  *H01L 23/66* (2006.01)
  *H05K 1/18* (2006.01)
(52) U.S. Cl.
  CPC ........ *H01L 2223/6661* (2013.01); *H05K 1/18* (2013.01); *H05K 2201/10196* (2013.01)
(58) Field of Classification Search
  CPC .. H01C 7/118; H01C 17/06586; H01C 7/105; H01C 17/06; H01L 23/62; H01L 23/66; H01L 2223/6661; H01L 23/295; H01L 23/642; H01L 23/00; H01L 23/647; H05K 1/18; H05K 2201/10196; H05K 2201/0738; H05K 1/167; H05K 1/16
  See application file for complete search history.

(56) References Cited

U.S. PATENT DOCUMENTS

| | | | | |
|---|---|---|---|---|
| 6,087,923 | A * | 7/2000 | Ahn | H01C 7/1006 338/21 |
| 7,695,644 | B2 | 4/2010 | Kosowsky et al. | |
| 10,141,090 | B2 * | 11/2018 | Kamata | H01C 7/105 |
| 11,339,269 | B2 * | 5/2022 | Kamata | H01C 7/102 |
| 2016/0379738 | A1 * | 12/2016 | Okamoto | B32B 18/00 174/260 |
| 2017/0261456 | A1 | 9/2017 | Lewicki et al. | |
| 2018/0197663 | A1 * | 7/2018 | Kamata | H01C 17/06586 |
| 2019/0157682 | A1 * | 5/2019 | Ho | H01M 10/0525 |
| 2021/0155769 | A1 | 5/2021 | Kamata | |
| 2022/0185667 | A1 | 6/2022 | Czubarow et al. | |

FOREIGN PATENT DOCUMENTS

| | | |
|---|---|---|
| JP | 2001093706 A | 4/2001 |
| WO | 2019116955 A1 | 6/2019 |
| WO | 2020202819 A1 | 10/2020 |

OTHER PUBLICATIONS

International Search Report (ISR) (and English translation thereof) dated May 11, 2021, issued in International Application No. PCT/JP2021/007631.

Written Opinion dated May 11, 2021, issued in International Application No. PCT/JP2021/007631.

Wang, et al., "Carbon Aerogel Composite Electrodes", Analytical Chemistry, 1993, 65, 17, pp. 2300-2303.

* cited by examiner

LOW-VOLTAGE VARISTOR, CIRCUIT BOARD, SEMICONDUCTOR COMPONENT PACKAGE, AND INTERPOSER

FIELD OF THE INVENTION

The present invention relates to a varistor comprising a cured body of a resin composition for forming a low-voltage varistor.

BACKGROUND ART

Patent documents 1 to 4 discloses a technique related to a varistor.

Patent document 1 discloses a laminated ceramic varistor with a sintered body in which a ceramic layer having $SrTiO_3$ as a main component and an internal electrode are alternately laminated in a plurality of layers, and the ceramic layer is formed of a ceramic having a void volume occupancy ratio of 1.35 to 4.85%. Patent document 1 discloses that the capacitance C of Examples is 5.5 to 32.0 nF.

Patent document 2 discloses a voltage switchable dielectric (VSD) material composition. Patent document 2 discloses that the VSD material composition comprises a binder and high aspect ratio (HAR) particles comprising conductive particles and/or semiconductor particles. FIG. 3C of Patent document 2 discloses that a change in electrical resistance as a varistor occurs in a range of 500 to 100 V.

Patent document 3 discloses a paste for forming a varistor element containing a resin composition containing (A) an epoxy resin, (B) a curing agent and (C) carbon nanotubes, wherein the content of the semiconductor-type single-walled carbon nanotubes in the carbon nanotubes is 70% by weight or more.

Patent document 4 discloses a resin composition for forming a varistor including (A) an epoxy resin, (B) a curing agent, (C) a carbon nanotube, and (D) a dispersant.

PRIOR ART REFERENCES

Patent Document

Patent document 1: JP 2001-93706 A
Patent document 2: U.S. Pat. No. 7,695,644 B
Patent document 3: U.S. Ser. No. 10/141,090 B
Patent document 4: WO 2019/116955 A

SUMMARY OF THE INVENTION

The varistor is an element (an electronic component or electric component) having properties such that it has a high electric resistance when a voltage between a pair of electrodes is low, and the electric resistance is rapidly reduced when the voltage between the electrodes is increased to a predetermined value or more. Generally, the varistor has a structure in which a material having non-linear resistance characteristics is disposed between a pair of electrodes. Examples of materials having non-linear resistance characteristics include silicon carbide, zinc oxide, strontium titanate, and the like.

For improving the varistor in performance and achieving reduction of the cost of the varistor, it is necessary to find and develop a new material for a varistor.

In a semiconductor device or the like, there are applications that require low-voltage varistors that are operable at a low voltage (for example, 10 V or less, preferably 8 V or less, more preferably 7 V or less).

It is also necessary that the varistor has excellent overvoltage protection characteristics. That is, as a varistor having excellent performance, it is required that the electric resistance rapidly decreases with an increase in the applied voltage (that is, the non-linear coefficient α, which will be described later, is high).

A varistor used in a high frequency region is required to have a low capacitance.

An object of the present invention is to provide a varistor having excellent performance that can operate at low voltage.

In order to solve the above problem, the present invention has the following configurations.

(Configuration 1)

A configuration 1 of the present invention is a low-voltage varistor comprising a cured body of a resin composition for forming the low-voltage varistor,
  wherein the resin composition for forming the low-voltage varistor comprises:
  (A) at least one selected from carbon nanotubes and carbon aerogels; and
  (B) at least one selected from epoxy resin and acrylic resin.

(Configuration 2)

A configuration 2 of the present invention is the low-voltage varistor according to the configuration 1, wherein a varistor voltage is 0.3 to 10 V when an inflow current of the low-voltage varistor is 0.1 mA.

(Configuration 3)

A configuration 3 of the present invention is the low-voltage varistor according to the configuration 1 or 2, wherein the non-linear coefficient α is 7 to 20 when a current-voltage characteristics of the low-voltage varistor is expressed by $I=KV^\alpha$ (V is an applied voltage, I is an inflow current, K is a constant, and α is the non-linear coefficient).

(Configuration 4)

A configuration 4 of the present invention is the low-voltage varistor according to any of the configurations 1 to 3, wherein the capacitance is 0.5 to 200 pF.

(Configuration 5)

A configuration 5 of the present invention is a circuit board equipped with the low-voltage varistor according to any of the configurations 1 to 4.

(Configuration 6)

A configuration 6 of the present invention is a semiconductor component package comprising the low-voltage varistor according to any of the configurations 1 to 4.

(Configuration 7)

A configuration 7 of the present invention is an interposer equipped with the low-voltage varistor according to any of the configurations 1 to 4.

According to the present invention, it is possible to provide a varistor having excellent performance capable of operating at low voltage.

MODE FOR CARRYING OUT THE INVENTION

As described below, an embodiment of the present invention will be described in detail with reference to the drawings. The following embodiment embodies the present invention, and should not be construed as limiting the scope of the present invention.

Low-Voltage Varistor

First, a low-voltage varistor according to the present invention is described. The low-voltage varistor of a present embodiment includes a cured body of a resin composition for forming the low-voltage varistor. The resin composition for forming the low-voltage varistor will be described later.

Figure 1:
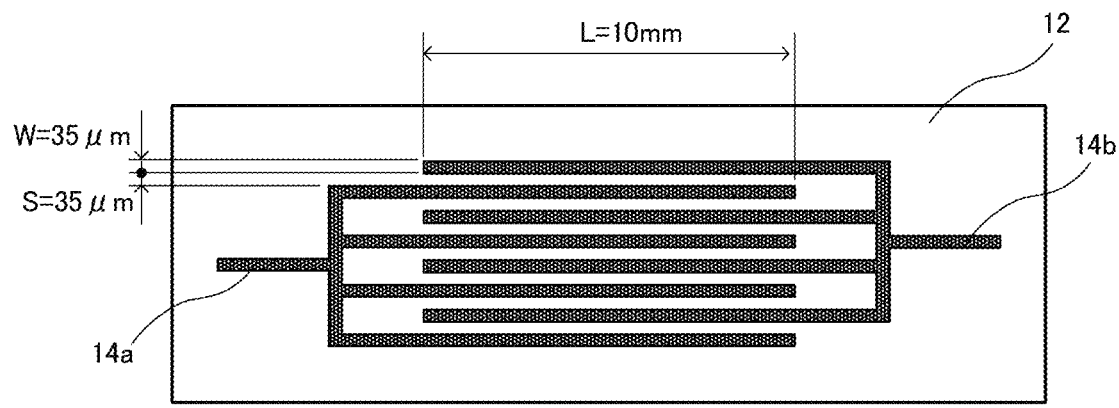
FIG. 1 is a schematic plan view of electrodes used in varistors of Examples of the present invention.
Figure 2:
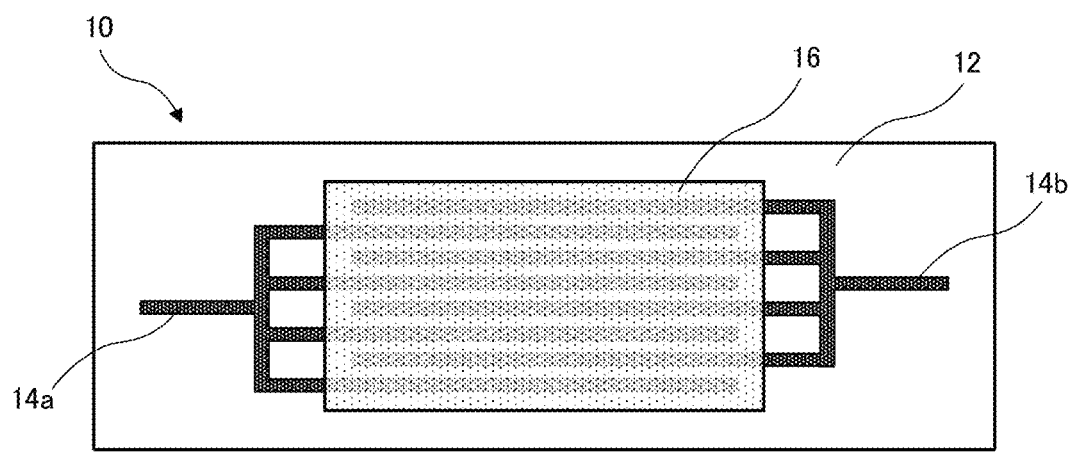
FIG. 2 is a schematic plan view of a varistor of Examples of the present invention.
Figure 3:
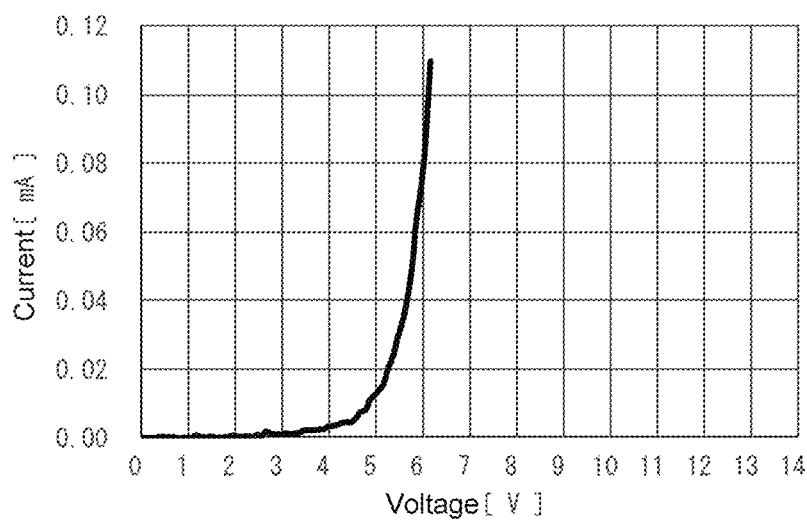
FIG. 3 is a diagram showing the current-voltage characteristics of the varistor of Example 1.
Figure 4:
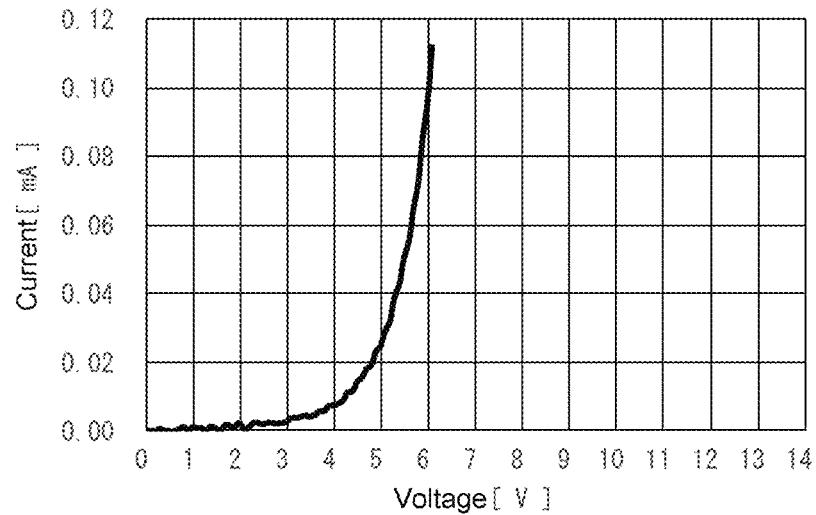
FIG. 4 is a diagram showing the current-voltage characteristics of the varistor of Example 2.
Figure 5:
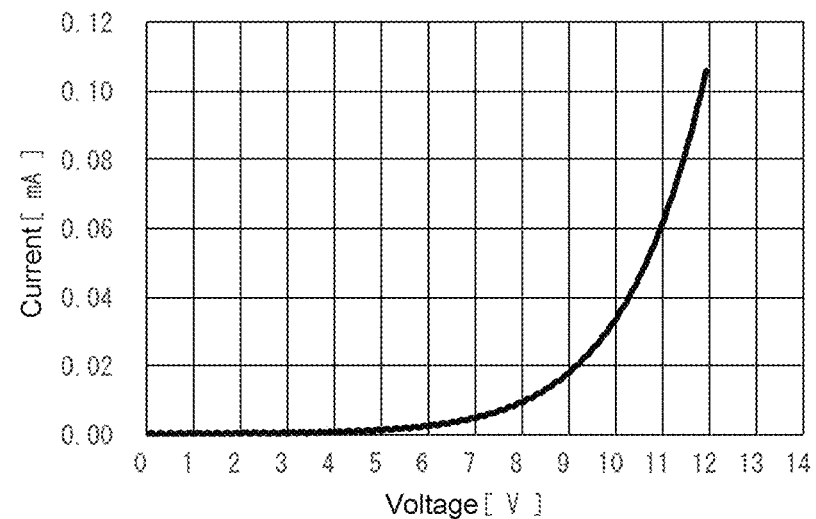
FIG. 5 is a diagram showing the current-voltage characteristics of the varistor of Comparative Example 1.
Figure 6:
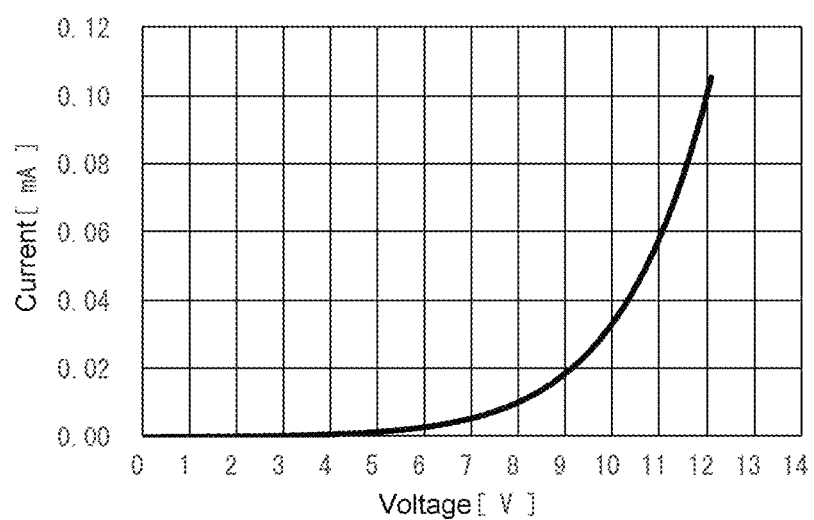
FIG. 6 is a diagram showing the current-voltage characteristics of the varistor of Comparative Example 2.

FIG. 2 shows a schematic view of an example of a varistor. The varistor shown in FIG. 2 has a structure in which a cured body 16 of a material having varistor characteristics (a resin composition for forming the low-voltage varistor) is disposed on a pair of electrodes 14a and 14b shown in FIG. 1. The structure of the varistor shown in FIG. 2 is merely an example, and any structure can be employed as long as it is the structure in which a material having varistor characteristics is disposed between a pair of electrodes. For example, a structure in which a material having varistor characteristics is disposed between electrodes arranged so that planes of the electrodes are parallel to each other, and a structure in which a pair of electrodes are three-dimensionally arranged in a comb-like form, and the like can be adopted.

The varistor is an electronic element (or electric element) having non-linear resistance characteristics. The relationship (a current-voltage characteristics) between a voltage V (applied voltage) applied to a pair of electrodes 14a and 14b of the varistor and a current I (inflow current) flowing between the terminals at that time can be approximated as an approximation formula of $I=K \cdot V^\alpha$, wherein K is a constant. This $\alpha$ in the approximation formula is a non-linear coefficient. A general ohmic resistor has a coefficient of $\alpha=1$, but a varistor has a coefficient of $\alpha>1$. When the varistor has a non-linear coefficient $\alpha$ of 7 or more, specifically $\alpha$ of 7 to 20, the varistor is considered to have excellent overvoltage protection characteristics.

By using the resin composition of the present embodiment, a varistor having excellent overvoltage protection characteristics, i.e., a varistor having a non-linear coefficient $\alpha$ of 7 or more, specifically $\alpha$ of 7 to 20, can be produced.

In the low-voltage varistor of the present embodiment, when the inflow current of the low-voltage varistor is 0.1 mA, the varistor voltage is preferably 0.3 to 10 V, more preferably 0.3 to 8 V, and more preferably 0.3 to 7 V. The low-voltage varistor of the present embodiment is particularly preferably used in an application where the varistor voltage is about 6 V when the inflow current of the low-voltage varistor is 0.1 mA. The low-voltage varistor of the present embodiment can operate at a relatively low voltage as compared with a conventional varistor. Therefore, the varistor of the present embodiment has excellent characteristics as a low-voltage varistor.

The low-voltage varistor of the present embodiment preferably has a capacitance of 0.5 to 200 pF, preferably 0.5 to 180 pF, and preferably 0.5 to 160 pF. The capacitance in this case can be measured using an oscillator frequency of 1 kHz. The low-voltage varistor of the present embodiment has a relatively low capacitance compared with a conventional varistor, and therefore has a low impedance at a high frequency. Therefore, it can be said that the varistor of the present embodiment has excellent characteristics as a low-voltage varistor in a high-frequency region.

A present embodiment is a circuit board equipped with the low-voltage varistor described above. The varistor of the present embodiment is preferably used as a low-voltage varistor in a high-frequency region. Therefore, by mounting the varistor of the present embodiment on a predetermined circuit board, a desired electronic circuit can be obtained.

A present embodiment is a semiconductor component package equipped with the low-voltage varistor described above. The varistor of the present embodiment is preferably used as a low-voltage varistor in a high-frequency region. Therefore, by mounting the varistor of the present embodiment on a predetermined semiconductor component package, it is possible to obtain a semiconductor component package that enables a desired operation.

A present embodiment is an interposer equipped with the low-voltage varistor described above. The interposer is a substrate having through electrodes for providing conduction between the circuit on the front surface and the circuit on the back surface of the substrate for high integration of the circuit. The varistor of the present embodiment is preferably used as a low-voltage varistor in a high-frequency region. Therefore, by mounting the varistor of the present embodiment on a predetermined interposer, it is possible to obtain a highly integrated electronic circuit that enables a desired operation.

Resin Composition for Forming Low-Voltage Varistor

Next, a resin composition for forming a low-voltage varistor for forming a cured body of the low-voltage varistor of the present embodiment is specifically described. In the present specification, the resin composition for forming the low-voltage varistor may be simply referred to as "a resin composition" (or "a resin composition of the present embodiment").

Component (A)

The resin composition for forming the low-voltage varistor of the present embodiment contains at least one selected from carbon nanotubes (A1) and carbon aerogel (A2) as a component (A).

Carbon nanotubes (A1) contained in a resin composition for forming the low-voltage varistor are described hereafter.

The carbon nanotubes are a material in the shape of coaxial tubes each formed of a network of 6-membered carbon rings. As carbon nanotubes, single-walled and multi-walled carbon nanotubes are known. The carbon nanotubes can be classified into metallic carbon nanotubes and semiconducting carbon nanotubes depending on their electric properties. The carbon nanotubes (A1) contained in the resin composition for forming a low-voltage varistor of the present embodiment are single-walled semiconducting carbon nanotubes.

The carbon nanotube (A1) is preferably a single-walled carbon nanotube. Specifically, as the carbon nanotube (A1), a single-walled carbon nanotube (TUBALL SWCNT 93%) manufactured by OCSIAL can be used. The TUBALL SWCNT 93% is a single-walled carbon nanotube having an outer diameter of 1.6 nm±0.4 nm, a length of 5 μm or more, and a carbon nanotube content of 93% or more.

The content of carbon nanotubes (A1) in the resin composition for forming a low-voltage varistor is preferably 0.01 to 2 parts by weight, more preferably 0.015 to 1 parts by weight, further more preferably 0.02 to 0.1 parts by weight, and particularly preferably 0.03 to less than 0.05 parts by weight, based on 100 parts by weight of epoxy resin (B).

A carbon aerogel (A2) contained in a resin composition for forming the low-voltage varistor is described hereafter.

The carbon aerogel is a porous carbon composed of a covalent bond of nano-sized molecules and having a high porosity. Hereinafter, carbon aerogel is also referred to as porous carbon.

In the present specification, the term "carbon aerogel (porous carbon)" means a carbon with porosity that is obtained by that the solvent contained in a gel-like mixture made from a material containing carbon is replaced with a gas by supercritical drying, and components other than carbon are removed by thermal decomposition.

The carbon aerogel (porous carbon) has a number of pores due to the production method therefor. The pores have a size of less than 1 μm, and the pores (nanopores) have a size of the order of nanometer. Generally, the size of the nanopores of porous carbon is 200 to 300 nm. The dimensions of the pores can be obtained as an average of the diameters of the plurality of pores in a SEM photograph using the SEM photograph obtained by photographing a cross section of the porous carbon with a scanning electron microscope (SEM). Diameters of the all pores seen in the SEM micrograph can be measured to determine an average of the diameters. Alternatively, diameters of, for example, 10 to 20 pores can be measured to determine an average of the diameters as a size of the pores.

Such porous carbon is preferably used as a material for manufacturing a varistor. Specifically, as the carbon aerogel (A2), carbon aerogel powder (model number: PC 16-151-10) manufactured by eM-TECH can be used.

The carbon aerogel powder PC 16-151-10 can be produced by the production method 1 described later. Specific manufacturing conditions of the carbon aerogel powder PC 16-151-10 are shown below. Furfural and phloroglucinol (molar ratio of furfural: phloroglucinol is 3:1) were dissolved in ethanol. The amount of ethanol during this dissolution was adjusted so that the total amount of furfural and phloroglucinol in the ethanol solution was 4% by weight. The ethanol solution of furfural and phloroglucinol was stirred and allowed to stand at room temperature to obtain a gelled solid. The ethanol as a solvent in the gelled solid was substituted with air by a supercritical carbon dioxide liquid in order to produce aerogel as a precursor. The carbon aerogel PC 16-151-10 is produced by firing the aerogel at 1000 degree C. under nitrogen gas flow.

The content of carbon aerogel (A2) in the resin composition for forming the low-voltage varistor is preferably 0.1 to 10 parts by weight, more preferably 0.5 to 5 parts by weight, further preferably 1 to 4.5 parts by weight, and particularly preferably 2 to 4 parts by weight based on 100 parts by weight of epoxy resin (B).

The carbon aerogel (porous carbon) according to the embodiment is described below in detail.

The porous carbon which can be used in the present embodiment has an $I_D/I_G$ of 2.0 or more in a Raman spectrum measured by Raman spectroscopy with respect to the porous carbon wherein the $I_G$ is an accumulated intensity of a peak for G band around 1590 cm$^{-1}$, and the $I_D$ is an accumulated intensity of a peak for D band around 1350 cm$^{-1}$. By using such porous carbon, a resin composition for producing a varistor having appropriate varistor characteristics and a paste for forming a varistor can be obtained.

The porous carbon which can be used in the present embodiment has a predetermined Raman spectrum when an intensity of Raman scattering at a wavenumber (unit: generally cm$^{-1}$) of Raman scattering (Raman shift) is measured by Raman spectroscopy. Generally, a material comprised of carbon has peaks appearing around 1590 cm$^{-1}$ and around 1350 cm$^{-1}$ due to the bonding states of carbon. The peak appearing around 1590 cm$^{-1}$ is considered to be a peak for G band derived from a sp$^2$ hybrid orbital, such as the bonding state of graphite. The peak appearing around 1350 cm$^{-1}$ is considered to be a peak for D band derived from a sp$^3$ hybrid orbital, such as the bonding state of diamond. The D band is considered to be caused due to diamond-like amorphous carbon, and therefore the higher intensity of the D band is considered to show that the bonding state of graphite is disordered. The porous carbon which can be used in the present embodiment has a characteristic feature that the porous carbon has an $I_D/I_G$ of 2.0 or more wherein the $I_G$ is an accumulated intensity of the peak for the G band around 1590 cm$^{-1}$, and the $I_D$ is an accumulated intensity of the peak for the D band around 1350 cm$^{-1}$. The $I_D/I_G$ is preferably 2.1 to 3.0, more preferably 2.2 to 2.5.

The accumulated intensity of a peak for the G band is an area of the peak obtained by subtracting the background, which is a noise, from a peak for the G band in a Raman spectrum that plots the intensity of Raman scattering with respect to the wave number of Raman scattering. The accumulated intensity of a peak for the D band is similarly determined. The peak for the G band and the peak for the D band are close to each other, and therefore the peak for the G band and the peak for the D band can be separated by peak fitting using an appropriate function, such as a Lorentzian function. Such a peak separation method has been known.

The porous carbon which can be used in the present embodiment preferably has an $M_D/M_G$ of 0.80 or more wherein the $M_G$ is a maximum intensity of a peak for the G band, and the $M_D$ is a maximum intensity of a peak for the D band.

The porous carbon which can be used in the present embodiment preferably has an $M_D/M_G$ of 0.80 or more in a Raman spectrum that plots the intensity of Raman scattering with respect to the wave number of Raman scattering, wherein the $M_G$ is a maximum intensity of a peak for the G band, and the $M_D$ is a maximum intensity of a peak for the D band. The maximum intensity $M_G$ of a peak for the G band is the maximum of the peak intensity for the G band of Raman scattering after subtracting the background, which is a noise, from the measured values in the wavenumber range constituting the peak for the G band. The maximum intensity $M_D$ of a peak for the D band is similarly determined. The peak for the G band and the peak for the D band are close to each other, and therefore the peak for the G band and the peak for the D band are separated by peak fitting using an appropriate function, such as a Lorentzian function, and then a maximum intensity $M_G$ and a maximum intensity $M_D$ can be determined. The $M_D/M_G$ is more preferably 0.80 to 3.0, further preferably 0.90 to 1.5. By using such porous carbon, a resin composition for producing a varistor having appropriate varistor characteristics and a paste for forming a varistor can be more surely obtained.

A method for producing the porous carbon of the embodiment of the present invention is described below.

[Production Method 1]

In Production Method 1 for the porous carbon which can be used in the present embodiment, the porous carbon can be produced by thermal decomposition of a mixture of raw materials containing furfural and phloroglucinol.

(Step of Providing Materials)

Production Method 1 for the porous carbon which can be used in the present embodiment comprises a step of providing materials. In the step of providing materials, furfural and phloroglucinol in the predetermined amounts are first provided. In the porous carbon which can be used in the present embodiment, the amount of the furfural in the raw materials is preferably 100 to 500 parts by weight, more preferably 120 to 340 parts by weight, further preferably 160 to 310 parts by weight, relative to 100 parts by weight of the phloroglucinol.

(Pretreatment Step)

Production Method 1 comprises a pretreatment step for dissolving phloroglucinol and furfural in ethanol to obtain an ethanol solution. In the pretreatment step, phloroglucinol is first dissolved in ethanol. Then, furfural is dissolved in the ethanol solution of phloroglucinol. In the dissolution, with respect to the amount of ethanol, ethanol can be used in such an amount that the concentration of the total of phloroglucinol and furfural in the ethanol solution becomes 1 to 45% by weight, preferably 1.5 to 30% by weight, more preferably 2 to 25% by weight. In Production Method 1, the concentration of the total of phloroglucinol and furfural in the ethanol solution in the pretreatment step (raw material concentration in the solvent) is referred to as "initial concentration (% by weight)".

(Gelling Step)

Production Method 1 comprises a step of gelling the ethanol solution of phloroglucinol and furfural. In the gelling step, the above-obtained ethanol solution of phloroglucinol and furfural is stirred, and then allowed to stand at room temperature, then a gelled solid is obtained.

(Cleaning Step)

Production Method 1 comprises a step of cleaning the gelled solid. In the cleaning step, the gelled solid is cleaned. In the cleaning, ethanol can be used, but the cleaning liquid is not limited to ethanol. Other alcohols can be used. In the cleaning, the gelled solid can be cleaned, for example, by repeatedly conducting the operation of adding ethanol to the gelled solid and discharging the added ethanol. The cleaning step can be performed until the discharged ethanol is not colored any more.

(Supercritical Drying Step)

Production Method 1 comprises a supercritical drying step for the cleaned solid. The gelled solid obtained after being cleaned is removed and subjected to supercritical drying. Specifically, the gelled solid is placed in a sealed vessel, and supercritical liquid $CO_2$ under a predetermined pressure is introduced into the sealed vessel. Then, this state is maintained, and then the supercritical liquid $CO_2$ is discharged. If necessary, this step can be repeatedly conducted.

(Thermal Decomposition Step)

Production Method 1 comprises a thermal decomposition step for the solid obtained after supercritical drying. In the thermal decomposition step, the above-obtained solid after supercritical drying is placed in a furnace, and the temperature is increased in a nitrogen gas atmosphere at a heating rate of 0.8 to 1.2 degree C./minute to 800 degree C. or higher (for example, 800 to 1500 degree C., preferably 800 to 1,200 degree C., more preferably 800 to 1000 degree C.). After completion of the temperature increase, that temperature is maintained for 5 to 60 minutes (preferably for 20 to 30 minutes), for performing thermal decomposition. As a result, the components other than carbon can be removed, and porous carbon is obtained.

(Pulverization Step)

Production Method 1 comprises a step of pulverizing the porous carbon obtained in the thermal decomposition step so as to be in a particulate form. In the pulverization step, the heated porous carbon is cooled to room temperature, and the porous carbon is pulverized, for obtaining powdered porous carbon. In the pulverization step, the porous carbon can be pulverized so that the porous carbon has a predetermined particle size. In the pulverization step, in view of the operating properties and others, the average particle size of the porous carbon is preferably 0.01 to 50 μm, further preferably 0.02 to 10 μm. With respect to the average particle size, the cumulative 50% particle size of the all particles (average particle diameter: D50) can be the above-mentioned particle size. The average particle diameter D50 can be determined by conducting particle size distribution measurement by means of a laser diffraction/scattering-type particle diameter distribution measurement apparatus LA-960, manufactured by HORIBA, Ltd. (laser diffraction/scattering method), and the average particle diameter D50 can be obtained by obtaining a D50 value from the results of the particle size distribution measurement.

Thus, the porous carbon can be produced by Production Method 1.

[Production Method 2]

In Production Method 2 for the porous carbon which can be used in the present embodiment, the porous carbon can be produced by thermal decomposition of a raw material containing a polyimide.

(Step of Providing Materials)

Production Method 2 for the porous carbon which can be used in the present embodiment comprises a step of providing materials. In the step of providing materials, pyromellitic anhydride and paraphenyldiamine in the predetermined amounts are provided.

(Pretreatment Step)

Production Method 2 comprises a pretreatment step for synthesizing a polyimide solution. In the pretreatment step of Production Method 2, a polyamic acid solution can be first synthesized using pyromellitic anhydride and paraphenyldiamine as materials. In the synthesis, dimethylacetamide and toluene can be used as a solvent. The total weight of the solvents (dimethylacetamide and toluene) relative to the total weight of pyromellitic anhydride and paraphenyldiamine can be selected so that the initial concentration of the polyamic acid solution synthesized becomes in a predetermined range. In Production Method 2, the initial concentration (% by weight) means a concentration of polyamic acid in the polyamic acid solution in the pretreatment step (the ratio of the total weight of pyromellitic anhydride and paraphenyldiamine, which are raw materials, to the weight of the polyamic acid solution after synthesized). The initial concentration is 1 to 45% by weight, preferably 1.5 to 30% by weight, more preferably 2 to 25% by weight, further preferably 10 to 15% by weight. Synthesis of polyamic acid solution can be conducted by mixing and heating pyromellitic anhydride and paraphenyldiamine. As a result, a polyamic acid solution can be synthesized. Subsequently, pyridine and acetic anhydride in the predetermined amounts are added to the above-obtained polyamic acid solution, and a polyimide solution can be synthesized.

(Gelling Step)

Production Method 2 comprises a step of gelling the polyimide solution. In the gelling step, the above-obtained polyimide solution is stirred. Then, the solution is allowed to stand at room temperature, and a gelled solid is obtained.

(Cleaning Step, Supercritical Drying Step, Heating Step, and Pulverization Step)

Production Method 2 comprises a cleaning step, a supercritical drying step, a heating step, and a pulverization step. In Production Method 2, after the above-mentioned gelling step, the cleaning step, the supercritical drying step, the heating step, and the pulverization step are conducted in the same manner as in Production Method 1, and the porous carbon can be produced.

With respect to the porous carbon which can be used in the present embodiment, in the thermal decomposition step of production methods 1 and 2, the peak temperature of the thermal decomposition conducted when producing the porous carbon is 800 degree C. or higher, preferably 800 to 1500 degree C., more preferably 800 to 1200 degree C., further preferably 800 to 1000 degree C. When the peak temperature of the thermal decomposition is the predetermined temperature, a porous carbon that is to be contained in a resin composition and the like for producing a varistor having appropriate varistor characteristics can be more surely obtained.

The outline of the porous carbon described above is as follows.

(Configuration 1 of a Porous Carbon)

A configuration 1 of a porous carbon is a porous carbon, wherein the porous carbon has an $I_D/I_G$ of 2.0 or more in a Raman spectrum measured by Raman spectroscopy with respect to the porous carbon, the $I_G$ is an accumulated intensity of a peak for G band around 1590 cm$^{-1}$, and the $I_D$ is an accumulated intensity of a peak for D band around 1350 cm$^{-1}$, and the porous carbon has pores having a size of less than 1 μm, and the porous carbon is the porous carbon for the varistor element.

By using the porous carbon of the configuration 1, a resin composition for producing a varistor element having appropriate varistor characteristics and a paste for forming a varistor element can be obtained.

(Configuration 2 of a Porous Carbon)

A configuration 2 of a porous carbon is the porous carbon of the configuration 1, wherein the porous carbon has an $M_D/M_G$ of 0.80 or more, and the $M_G$ is a maximum intensity of a peak for the G band, and the $M_D$ is a maximum intensity of a peak for the D band.

By using the porous carbon of the configuration 2, a resin composition for producing a varistor element having appropriate varistor characteristics and a paste for forming a varistor element can be more surely obtained.

(Configuration 3 of a Porous Carbon)

A configuration 3 of a porous carbon is the porous carbon of the configuration 1 or 2, wherein the peak temperature of the thermal decomposition when producing the porous carbon is 800 to 1500 degree C.

By using the porous carbon of the configuration 3, a porous carbon that is to be contained in a resin composition and the like for producing a varistor element having appropriate varistor characteristics can be more surely obtained.

(Configuration 4 of a Porous Carbon)

A configuration 4 of a porous carbon is the porous carbon of any one of the configurations 1 to 3, wherein the porous carbon is produced by thermal decomposition of a mixture of raw materials containing furfural and phloroglucinol.

By using the porous carbon of the configuration 4, a porous carbon that is to be contained in a resin composition and the like for producing a varistor element having appropriate varistor characteristics can be further surely obtained.

(Configuration 5 of a Porous Carbon)

A configuration 5 of a porous carbon is the porous carbon of the configuration 4, wherein the amount of the furfural in the raw materials is 100 to 500 parts by weight, relative to 100 parts by weight of the phloroglucinol.

By the configuration 5 of the porous carbon in which the amount of the furfural relative to the phloroglucinol is in an appropriate range, a porous carbon that is to be contained in a resin composition and the like for producing a varistor element having appropriate varistor characteristics can be more easily obtained.

(Configuration 6 of a Porous Carbon)

A configuration 6 of a porous carbon is the porous carbon of any one of the configurations 1 to 3, wherein the porous carbon is produced by thermal decomposition of a raw material containing a polyimide.

By the configuration 6 of the porous carbon in which a polyimide is used as a raw material, a porous carbon that is to be contained in a resin composition and the like for producing a varistor element having appropriate varistor characteristics can be more surely obtained.

By using the porous carbon (carbon aerogel) described above, a resin composition for forming a low-voltage varistor in order to produce a low-voltage varistor having excellent performance can be obtained.

Component (B)

The resin composition for forming the low-voltage varistor of the present embodiment contains at least one selected from an epoxy resin and an acrylic resin as a component (B).

The epoxy resin of the component (B) preferably contains at least one selected from bisphenol A epoxy resin, brominated bisphenol A epoxy resin, bisphenol F epoxy resin, biphenyl epoxy resin, novolak epoxy resin, alicyclic epoxy resin, naphthalene epoxy resin, ether epoxy resin, polyether epoxy resin, and silicone-epoxy copolymer resin.

When the resin composition contains a predetermined epoxy resin, a varistor, in which the materials for the varistor are appropriately cured, can be produced.

In the resin composition for forming the low-voltage varistor of the present embodiment, an acrylic resin can be used as the component (B) instead of or in combination with the epoxy resin described above. As the monomer of the acrylic resin, specifically, methyl acrylate, ethyl acrylate, propyl acrylate, butyl acrylate, hexyl acrylate, 2-ethylhexyl acrylate, cyclohexyl acrylate, benzyl acrylate, dimethylaminoethyl acrylate, hydroxyethyl acrylate, hydroxylopyl acrylate, glycidyl acrylate, and the like are exemplified as the acrylic ester. Examples of the methacrylic ester include methyl methacrylate, ethyl methacrylate, propyl methacrylate, butyl methacrylate, hexyl methacrylate, 2-ethylhexyl methacrylate, cyclohexyl methacrylate, benzyl methacrylate, dimethylaminoethyl methacrylate, hydroxyethyl methacrylate, hydroxypropyl methacrylate, glycidyl methacrylate, and the like. A polymerization initiator for forming the acrylic resin by polymerizing the monomer can be used.

Curing Agent (C)

The resin composition of the present embodiment preferably contains amine compound, phenol, acid anhydride, imidazole compound, or a mixture thereof as the curing agent (C). The curing agent (C) preferably contains amine compound and imidazole compound. When the resin composition contains a predetermined curing agent, the epoxy resin can be appropriately cured upon producing a varistor. In the following description, the component (B) and the curing agent (C) may be referred to as "resin component".

The curing agent contained in the resin composition of the present embodiment preferably contains imidazole compound. As an imidazole compound, for example, imidazole or imidazole derivative can be used. In the varistor of the present embodiment, when containing imidazole compound, particularly imidazole as a curing agent, a varistor having more excellent varistor characteristics, specifically having a high non-linear coefficient α can be obtained. Specifically, "2P4MHZ-PW" manufactured by Shikoku Chemical Industry Co., Ltd. can be used as the imidazole-based curing agent. Further, when the curing agent contains both of the imidazole compound (particularly the imidazole) and the amine compound other than the imidazole compound, a varistor having a higher non-linear coefficient α can be obtained.

With respect to the amine compound other than the imidazole compound, amine compound selected from an aliphatic amine, an alicyclic amine, an aromatic amine, 3,3'-diethyl-4,4'-diaminodiphenylmethane, and diethyltoluenediamine can be used. Particularly, as an amine compound, 3,3'-diethyl-4,4'-diaminodiphenylmethane (which is commercially available as aromatic amine curing agent "KAYAHARD A-A" (manufactured by Nippon Kayaku Co., Ltd.)) and/or diethyltoluenediamine (which is commercially available as "ETHACURE", manufactured by Albemarle Corporation) can be preferably used.

When the curing agent contained in the resin composition of the present embodiment contains imidazole compound, the weight ratio of the imidazole compound contained in the total of the resin components (component (B) and curing agent (C)) is preferably 1 to 20% by weight, more preferably 2 to 15% by weight, and more preferably 5 to 10% by weight. When the imidazole compound is incorporated in a predetermined amount, a varistor having a high non-linear coefficient α can be surely obtained.

When the curing agent contained in the resin composition of the present embodiment contains amine compound other than the imidazole compound, the weight ratio of the amine compound contained in the total of the resin components (component (B) and curing agent (C)) is preferably 10 to 35% by weight, more preferably 15 to 30% by weight, and more preferably 20 to 27% by weight. A varistor having a high non-linear coefficient α can be surely obtained by blending a prescribed amount of the amine compound other than the imidazole compound.

It is preferred that the resin composition of the present embodiment and the below-mentioned paste for forming a varistor do not contain inorganic component (such as a filler) other than the porous carbon, namely, they are filler-less. In the case of using the resin composition of the present embodiment, even when the resin composition and the paste for forming a varistor have such a simple configuration that does not contain inorganic component such as a filler, a varistor having appropriate varistor characteristics can be produced.

Paste for Forming a Varistor

A paste for forming a varistor can be obtained by using the above-described resin composition for forming the low-voltage varistor of the present embodiment. The resin composition for forming the low-voltage varistor of the present embodiment can be used as a paste for forming a varistor as it is. However, from the viewpoint of achieving excellent application of the paste in screen printing and the like, the paste for forming a varistor can further contain solvent and other additives.

The varistor forming paste of the present embodiment may further include a dispersant (D). The dispersant (D) preferably contains at least one selected from the group consisting of an anionic surfactant, a cationic surfactant, an amphoteric surfactant, a nonionic surfactant, a hydrocarbon surfactant, a fluorine surfactant, a silicon surfactant, a polycarboxylic acid, a polyether carboxylic acid, a polycarboxylate, an alkyl sulfonate, an alkyl benzene sulfonate, an alkyl ether sulfonate, an aromatic polymer, an organic conductive polymer, a polyalkyl oxide surfactant, an inorganic salt, an organic acid salt, and an aliphatic alcohol. The dispersant (D) is preferably blended in an amount of 0.05 to 1 parts by weight, more preferably in an amount of 0.1 to 0.7 parts by weight based on 100 parts by weight of a total of the resin composition (epoxy resin, curing agent and porous carbon).

The paste for forming a varistor in the present embodiment can contain solvent. Examples of the solvents include aromatic hydrocarbons, such as toluene and xylene; ketones, such as methyl ethyl ketone, methyl isobutyl ketone and cyclohexanone; ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, and their corresponding esters such as acetate; terpineol, and the like. The solvent is preferably incorporated in an amount of 2 to 10 parts by weight, relative to 100 parts by weight of a total of the above-mentioned resin composition (the total of the epoxy resin, curing agent, and porous carbon).

The paste for forming a varistor in the present embodiment can further contain at least one selected from the group consisting of coloring agent, such as an inorganic pigment and an organic pigment, ion trapping agent, flame retardant, silane coupling agent, leveling agent, thixotropic agent, elastomer, curing accelerator, metal complex, dispersant, and anti-foaming agent.

The paste for forming a varistor in the present embodiment can be produced by charging (A) at least one selected from carbon nanotubes and carbon aerogels, (B) at least one selected from epoxy resins and acrylic resins, and other components such as a curing agent (C) and a solvent, into a mixing machine, such as a planetary stirring machine, a dissolver, a bead mill, a grinding kneader, a three-roll mill, a rotary mixer, or a twin-screw mixer, and mixing these components. Thus, a resin composition suitable for producing a varistor can be produced. A paste for forming a varistor having a viscosity suitable for screen printing, dipping, or other desired coating film or wiring formation method can be prepared from the paste for forming a varistor of the present embodiment.

A varistor having appropriate varistor characteristics can be produced by applying the above-mentioned paste for forming a varistor in the present embodiment to a predetermined electrode so as to be in contact with the electrode, and curing the paste. Examples of application methods include screen printing and dipping.

According to the present embodiment of the present invention, it is possible to obtain a varistor having excellent varistor characteristics capable of operating at a low voltage.

EXAMPLES

As described below, the embodiment of the present invention will be described in detail with reference to the following Examples, which should not be construed as limiting the scope of the present invention.

Materials and Compounding Ratio of Resin Composition of Examples

Materials used for producing the resin composition for forming the low-voltage varistor of Examples are as follows. Table 1 shows the weight ratios of the materials of Examples and Comparative Examples. The weight ratios of the components shown in Table 1 are all expressed in parts by weight, and the weight of the epoxy resin (B) is 100 parts by weight.

The following carbon nanotubes (A1) and carbon aerogels (A2) are used as components (A).

As the carbon nanotubes (A1), single-walled carbon nanotubes (TUBALL SWCNT 93% manufactured by OCSIAL) were used. Note that carbon nanotubes (A1) were used in Example 1.

As the carbon aerogel (A2), carbon aerogel powder (PC16-151-10 manufactured by eM-TECH Co., Ltd.) is used. The carbon aerogel powder (PC16-151-10 manufactured by eM-TECH Co., Ltd.) was manufactured by the above-mentioned Production Method 1. In this case, the molar ratio of furfural:phloroglucinol was set to 3:1, and the amount of ethanol at the time of dissolution was adjusted so that the concentration of the total amount of furfural and phloroglucinol in the ethanol solution was 4% by weight. Carbon aerogel powder (PC16-151-10) is prepared by firing aerogel as a precursor at 1000 degree C. under a nitrogen gas flow. The carbon aerogel (A2) was used in Example 2.

Epoxy Resin (B)

The epoxy resin used in Example 1 is epoxy resin B1 described as follows, and the epoxy resin used in Example 2 is epoxy resin B2 described as follows.

The epoxy resin B1 is an epoxy resin obtained by mixing 60% by weight of a bisphenol F-type epoxy resin and 40% by weight of a bisphenol A-type epoxy resin. "YDF-8170" manufactured by Nippon Steel & Sumitomo Metal Chemical Co., Ltd. is used as the bisphenol F type epoxy resin. "jER 1001" manufactured by Mitsubishi Chemical Corporation is used as the bisphenol A type epoxy resin.

The epoxy resin B2 is an epoxy resin obtained by mixing 80% by weight of a bisphenol F type epoxy resin and 20% by weight of a bisphenol A type epoxy resin. "YDF-8170" manufactured by Nippon Steel & Sumitomo Metal Chemical Co., Ltd. is used as the bisphenol F type epoxy resin. "jER 1001" manufactured by Mitsubishi Chemical Corporation is used as the bisphenol A type epoxy resin.

Two kinds of curing agents C1 and C2 described as follows were used as curing agents (C).

Curing agent C1: Amine curing agent, 3,3'-diethyl-4,4'-diaminodiphenylmethane ("KAYAHARDA-A (HDAA)" manufactured by Nippon Kayaku Co., Ltd.).

Curing agent C2: Imidazole-based curing agent ("2P4MHZ-PW" manufactured by Shikoku Chemical Industry Co., Ltd.)

A polyether carboxylic acid ("HIPLAAD ED 451" manufactured by Kusumoto Kasei Co., Ltd.) was used as dispersant (D).

The components (A) to (D) of the weight ratio shown in Table 1 were mixed in three rolls to prepare a resin composition for forming a low-voltage varistor.

Manufacture of Varistor of Examples

For manufacturing a varistor, a substrate 12 having comb-shaped electrodes 14a and 14b was used, as shown in FIG. 1. Electrodes 14a and 14b were formed by photolithography using a polyimide film with copper foil of 8 μm thick as the substrate 12. Further, a tin thin film of 0.2 μm was formed on the surfaces of the comb-shaped electrodes 14a and 14b by plating. The line width W of the electrode lines constituting the comb-shaped electrodes 14a and 14b is 35 μm, and the space width S, which is the width between the electrode lines, is 35 μm. The length L of the overlap portion where the electrode lines of the opposing electrodes 14a and 14b are overlapped is 10 mm.

Next, as shown in FIG. 2, the resin composition for forming the low-voltage varistor of Examples 1 and 2 described above was applied by a screen printing method so as to cover the overlapping portion of the comb-shaped electrodes 14a and 14b formed on the surface of the substrate 12 of FIG. 1. Thereafter, the substrate 12 coated with the resin composition for forming the low-voltage varistor was heated at 165 degree C. for 2 hours to form a cured body 16 of the resin composition for forming the low-voltage varistor, thereby producing the low-voltage varistor. The thickness of the cured body 16 was 15 μm.

Comparative Examples 1 and 2

As the varistors of Comparative Examples 1 and 2, a commercially available low-voltage laminated ceramic chip varistor (a chip-type laminated varistor manufactured by Panasonic Corporation) was used. The product name of the barista of Comparative Example 1 is "EZJS1VB822", and the product name of the barista of Comparative Example 2 is "EZJS2VB223".

Evaluation

Various characteristics of Examples 1 and 2 and Comparative Examples 1 and 2 were measured and their performance was evaluated as follows.

(Measurement of Current-Voltage Characteristics of Varistor)

The current-voltage characteristics of the low-voltage varistors of the Examples manufactured as described above and the commercially available Comparative Examples were measured with a Keithley source meter 2611B. Specifically, the current-voltage characteristics of the varistor were measured by applying a variable voltage to a pair of electrodes (electrodes 14a and 14b) of the varistor and measuring a current value when a predetermined voltage was applied. FIGS. 3, 4, 5 and 6 show current-voltage characteristics of Examples 1 and 2, and Comparative Examples 1 and 2.
(Varistor Voltage)

From the current-voltage characteristic measurement data of FIGS. 3 to 6, varistor voltage ($V_{0.1\ mA}$) at a current value of 0.1 mA can be obtained. Table 2 shows the varistor voltages ($V_{0.1\ mA}$) of the varistors of Examples and Comparative Examples.
(Calculation of Non-Linear Coefficient $\alpha$)

Next, the non-linear coefficient $\alpha$ was calculated from the data of the current-voltage characteristics of FIGS. 3 to 6. Specifically, the current-voltage characteristic data were analyzed by a simulator, and the value of the non-linear coefficient $\alpha$ which met $I=K \cdot V^\alpha$ was calculated by curve fitting. Table 2 shows the calculation results of the non-linear coefficient $\alpha$ of the varistors of Examples and Comparative Examples. When the non-linear coefficient $\alpha$ of the varistor is 7 or more, it can be said that the varistor has excellent overvoltage protection characteristics, and therefore, it can be said that the varistor has excellent varistor characteristics.
(Measurement of Capacitance)

Capacitance was measured using a capacitance meter 4288A manufactured by Agilent Corporation at an oscillator voltage of 1 Vrms and an oscillator frequency of 1 kHz. Table 2 shows the measurement results of the capacitance of the varistors of Examples and Comparative Examples.
(Evaluation of Results)

As shown in Table 2, the varistor voltages of the varistors of Examples 1 and 2 were 10 V or less, which was lower than the varistor voltages of Comparative Examples 1 and 2. Therefore, it is clear that the varistors of Examples 1 and 2 have excellent characteristics as low-voltage varistors. The non-linear coefficient $\alpha$ of the varistors of Examples 1 and 2 was 7 or more, which was higher than the non-linear coefficient $\alpha$ of Comparative Examples 1 and 2. Therefore, it is clear that the varistors of Examples 1 and 2 have superior overvoltage protection characteristics as varistors. The capacitance of the varistors of Examples 1 and 2 was 200 pF or less, which was lower than that of Comparative Examples 1 and 2. Therefore, it is clear that the varistors of Examples 1 and 2 have a high impedance at a high frequency and are superior as a low-voltage varistor in a high frequency region.

TABLE 1

| Unit: parts by weight | | Example 1 | Example 2 |
|---|---|---|---|
| (A1) Carbon nanotubes | | 0.04 | |
| (A2) Carbon nanotubes | | | 3.04 |
| (B) Epoxy Resin | B1 | 100 | |
| | B2 | | 100 |
| (C) Curing agent | C1 | 32.08 | 37.87 |
| | C2 | 10 | 10 |
| (D) Dispersant | | 0.21 | 0.3 |

TABLE 2

| Evaluation Results | Example 1 | Example 1 | Comparative Example 1 | Comparative Example 2 |
|---|---|---|---|---|
| Varistor Voltage ($V_{0.1\ mA}$) | 6.1 | 6.0 | 11.8 | 12.0 |
| Non-linear Coefficient $\alpha$ | 11.0 | 8.0 | 6.4 | 6.0 |

TABLE 2-continued

| Evaluation Results | Example 1 | Example 1 | Comparative Example 1 | Comparative Example 2 |
|---|---|---|---|---|
| Capacitance (pF, Oscillator frequency 1 kHz) | 75 | 155 | 8336 | 19763 |

Reference Examples and Reference Comparative Examples

Next, Reference Examples and Reference Comparative Examples of the present embodiment are described. The present invention is not limited to Reference Examples and Reference Comparative Examples. In the following description, "porous carbon" means carbon aerogel. The carbon aerogel (porous carbon) described below can be used as a raw material (carbon aerogel) of a resin composition for forming a low-voltage varistor in order to produce the low-voltage varistor of the present embodiment.

Production of Porous Carbon

The methods for producing the porous carbon used in Reference Examples and Reference Comparative Examples are first described. The materials and production conditions used in producing the porous carbon used in the Reference Examples and Reference Comparative Examples are shown in Tables 3 and 4. The porous carbon in Reference Examples 2 to 4 and Reference Comparative Examples 1 to 4 was produced by Production Method 1 using furfural and phloroglucinol as materials (raw materials). The porous carbon in Reference Example 1 and Reference Comparative Example 5 was produced by Production Method 2 using pyromellitic acid and paraphenyldiamine as main materials (raw materials).

Production Method 1: Method for Producing the Porous Carbon in Reference Examples 2 to 4 and Reference Comparative Examples 1 to 4

Amounts of incorporated materials for the porous carbon in Reference Examples 2 to 4 are shown in Table 3, and amounts of incorporated materials for the porous carbon in Reference Comparative Examples 1 to 4 are shown in Table 4.
(Step of Providing Materials)

In the method for producing the porous carbon in Reference Examples 2 to 4 and Reference Comparative Examples 1 to 4 (Production Method 1), furfural and phloroglucinol in the predetermined amounts shown in Tables 3 and 4 were first provided.
(Pretreatment Step)

Then, phloroglucinol was dissolved in ethanol. Then, furfural was dissolved in the ethanol solution of phloroglucinol. In the dissolution, ethanol was used in such an amount that the total weight of phloroglucinol and furfural was to be the initial concentration shown in Tables 3 and 4. In Production Method 1, the initial concentration (% by weight) means a concentration of the total of phloroglucinol and furfural in the ethanol solution (raw material concentration in the solvent).
(Gelling Step)

Then, the above-obtained ethanol solution of phloroglucinol and furfural was stirred. Then, the solution was allowed to stand at room temperature, making it possible to gel the solution.

(Cleaning Step)

Then, the gelled solid was cleaned. In the cleaning, ethanol was used. The gelled solid was cleaned by repeatedly conducting the operation of adding ethanol to the gelled solid and discharging the added ethanol. The cleaning was performed until the discharged ethanol was not colored any more.

(Supercritical Drying Step)

Then, the gelled solid obtained after being cleaned was removed and subjected to supercritical drying. Specifically, the solid material was placed in a sealed vessel, and supercritical liquid $CO_2$ was introduced into the sealed vessel. Then, this state was maintained for a predetermined period of time, and then the supercritical liquid $CO_2$ was discharged. Supercritical drying was made by repeatedly conducting the operation of introducing supercritical liquid $CO_2$ and discharging the $CO_2$.

(Thermal Decomposition Step)

The above-obtained solid after supercritical drying was placed in a furnace, and the temperature was increased in a nitrogen gas atmosphere at a heating rate of 1 degree C./minute to 800 degree C. or higher in the case of the Reference Examples (specifically, the firing temperature shown in Tables 3 and 4), and thermal decomposition was achieved. After completion of the temperature increase, that temperature was maintained for 30 minutes. As a result, the components other than carbon were able to be removed, and porous carbon was obtained.

(Pulverization Step)

The heated porous carbon was cooled to room temperature and pulverized, and porous carbon in Reference Examples 2 to 4 and Reference Comparative Examples 1 to 4 was obtained.

Production Method 2: Method for Producing the Porous Carbon in Reference Example 1 and Reference Comparative Example 5

Amounts of incorporated materials for the porous carbon in Reference Example 1 are shown in Table 3, and amounts of incorporated materials for the porous carbon in Reference Comparative Example 5 are shown in Table 4.

(Step of Providing Materials)

In the method for producing the porous carbon in Reference Example 1 and Reference Comparative Example 5 (Production Method 2), pyromellitic acid and paraphenyldiamine in the predetermined amounts shown in Tables 3 and 4 were first provided.

(Pretreatment Step)

Then, a polyamic acid solution was synthesized using pyromellitic acid and paraphenyldiamine as materials. In the synthesis, as a solvent, solvents (dimethylacetamide and toluene) were used in such a weight that the total weight of pyromellitic anhydride and paraphenyldiamine which are raw materials in the polyamic acid solution corresponded to the initial concentration shown in Tables 3 and 4. A mixed solvent of dimethylacetamide and toluene was used as the solvent. Synthesis of polyamic acid solution was conducted by mixing and heating pyromellitic acid and paraphenyldiamine. As a result, a polyamic acid solution was able to be synthesized. Subsequently, pyridine and acetic anhydride were added to the above-obtained polyamic acid solution in the predetermined amounts shown in Tables 3 and 4. As a result, a polyimide solution was able to be obtained.

(Gelling Step)

Then, the polyimide solution was stirred. Then, the solution was allowed to stand at room temperature, and a gelled solid was obtained.

(Other Steps)

Then, a cleaning step, a supercritical drying step, a thermal decomposition step, and a pulverization step were conducted in the same manner as in Production Method 1, and porous carbon in Reference Example 1 and Reference Comparative Example 5 was produced. The temperature after the temperature increase in the heating step was the temperature shown in Tables 3 and 4.

Note that the pulverization step was conducted so that the porous carbon in the Reference Examples and Reference Comparative Examples had an average particle size D50 of 25 nm.

Scanning Electron Microscope (SEM) Micrograph

Figure 7:
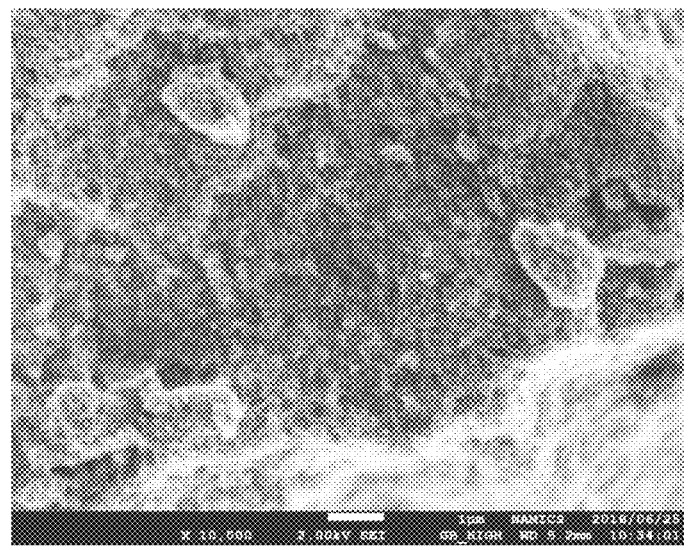
FIG. 7 is a SEM micrograph (magnification: 10000 times) of the porous carbon in Reference Example 1.
Figure 8:
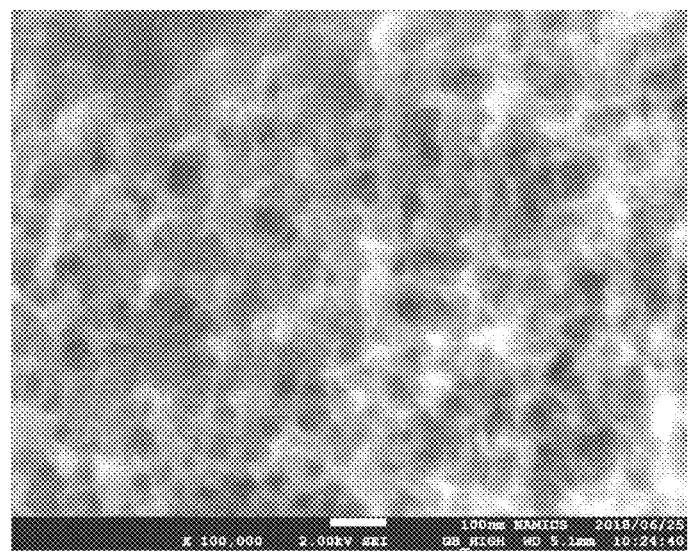
FIG. 8 is a SEM micrograph (magnification: 100000 times) of the porous carbon in Reference Example 1.
Figure 9:
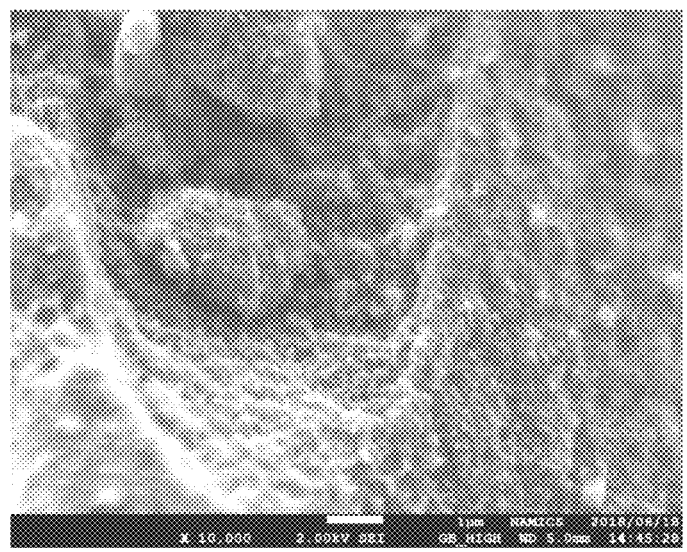
FIG. 9 is a SEM micrograph (magnification: 10000 times) of the porous carbon in Reference Example 2.
Figure 10:
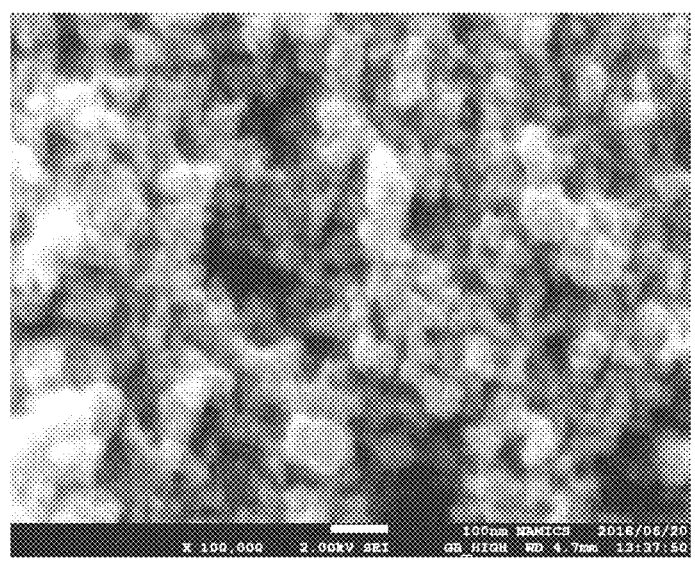
FIG. 10 is a SEM micrograph (magnification: 100000 times) of the porous carbon in Reference Example 2.
Figure 11:
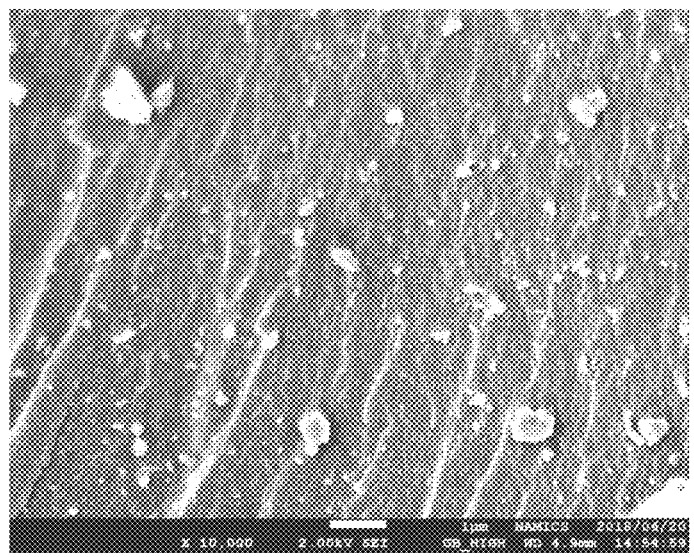
FIG. 11 is a SEM micrograph (magnification: 10000 times) of the porous carbon in Reference Comparative Example 2.
Figure 12:
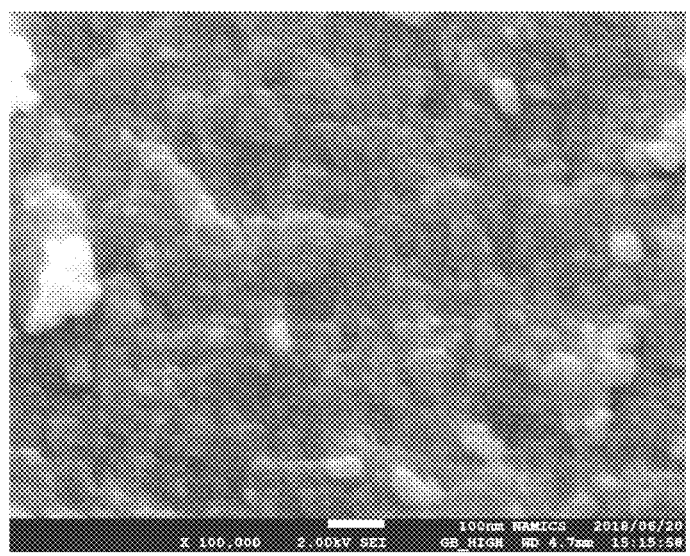
FIG. 12 is a SEM micrograph (magnification: 100000 times) of the porous carbon in Reference Comparative Example 2.

FIGS. 7 to 12 show scanning electron microscope (SEM) micrographs of the surface of the porous carbon obtained as mentioned above in Reference Examples 1 and 2 and Reference Comparative Example 2. The SEM micrographs in Reference Example 1 are shown in FIG. 7 (magnification: 10000 times) and FIG. 8 (magnification: 100000 times). The SEM micrographs in Reference Example 2 are shown in FIG. 9 (magnification: 10000 times) and FIG. 10 (magnification: 100000 times). The SEM micrographs in Reference Comparative Example 2 are shown in FIG. 11 (magnification: 10000 times) and FIG. 12 (magnification: 100000 times). As can be seen in the SEM micrographs in Reference Examples 1 and 2, a number of pores of less than 1 μm are present. In contrast, in the SEM micrographs in Reference Comparative Example 2, a number of pores of less than 1 μm are not present, and the surface appears to be relatively smooth.

Measurement by Raman Spectroscopy

Figure 13:
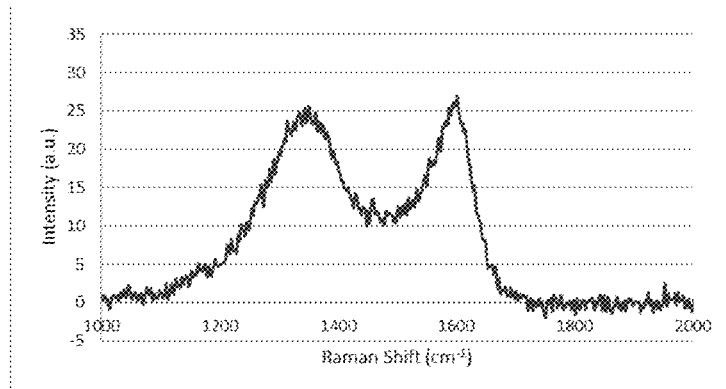
FIG. 13 is a Raman spectrum of the porous carbon in Reference Example 1.
Figure 14:
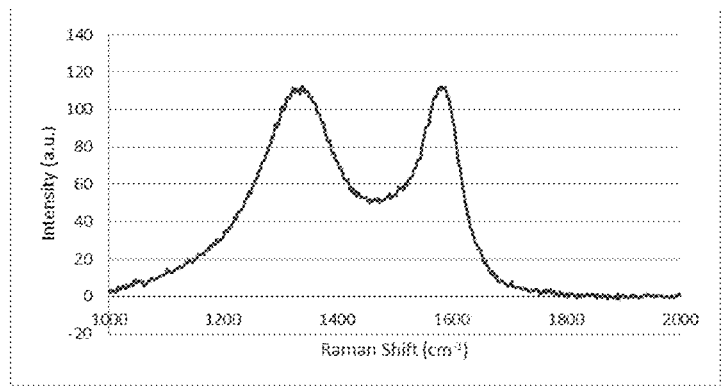
FIG. 14 is a Raman spectrum of the porous carbon in Reference Example 2.
Figure 15:
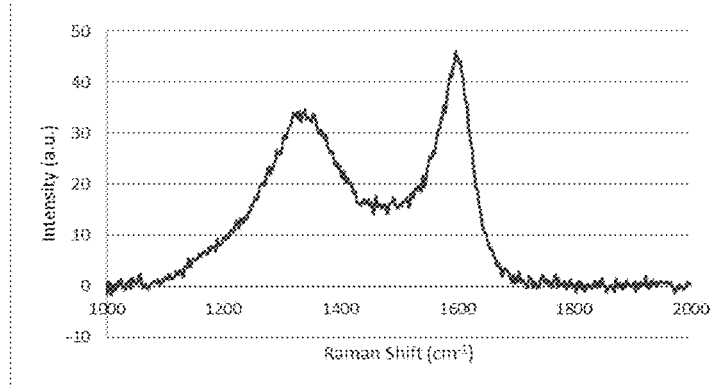
FIG. 15 is a Raman spectrum of the porous carbon in Reference Comparative Example 2.

Raman spectra of the porous carbon obtained as mentioned above in the Reference Examples and Reference Comparative Examples were obtained by measurement of Raman spectroscopy. FIGS. 13 to 15 show the Raman spectra in Reference Example 1, Reference Example 2, and Reference Comparative Example 2, respectively. In FIGS. 13 to 15, the horizontal axis indicates a Raman shift (unit: $cm^{-1}$), and the vertical axis indicates a signal intensity (arbitrary unit) of a Raman scattered light.

As a measurement apparatus for Raman spectroscopy, "Cora 7100" (manufactured by Anton Paar GmbH) was used. The emitted laser had a wavelength of 532 nm and an intensity of 50 mW, and the measurement time was 60 seconds. As can be seen from FIGS. 13 to 15, a peak for G band around 1590 $cm^{-1}$ and a peak for D band around 1350 $cm^{-1}$ were observed in the Raman spectra. If necessary, processing, such as subtraction of the background from the obtained signal, can be made.

From the Raman spectrum obtained by the measurement made by Raman spectroscopy, an accumulated intensity $I_G$ of the peak for the G band around 1590 $cm^{-1}$ and an accumulated intensity $I_D$ of the peak for the D band around 1350 $cm^{-1}$ were determined, and a ratio of the accumulated intensities of the G band and the D band ($I_D/I_G$) was determined. The ratios of the accumulated intensities of the G band and the D band ($I_D/I_G$) of the porous carbon in the Reference Examples and Reference Comparative Examples are shown in Tables 3 and 4.

Similarly, the measurement was made by Raman spectroscopy, a maximum intensity $M_G$ of the peak for the G band and a maximum intensity $M_D$ of the peak for the D band were obtained from the obtained Raman spectrum, and a ratio of the maximum intensities of the peaks for the G band and the D band ($M_D/M_G$) was determined. The ratios of the maximum intensities of the peaks for the G band and the D band ($M_D/M_G$) in the Reference Examples and Reference Comparative Examples are shown in Tables 3 and 4.

Materials for the Resin Composition and Formulation of the Materials

Materials used for the resin composition in the Reference Examples and Reference Comparative Examples are as follows. The formulations of the materials in the Reference Examples and Reference Comparative Examples are shown in Tables 3 and 4.
(Epoxy Resin)
Epoxy resin used in the Reference Examples and Reference Comparative Examples is an epoxy resin which is a mixture of a bisphenol F epoxy resin (grade "YDF-8170", manufactured by Nippon Steel & Sumikin Chemical Co., Ltd.) (80% by weight) and a bisphenol A epoxy resin ("1001", manufactured by Mitsubishi Chemical Corporation) (20% by weight).
(Curing Agent)
A mixture of amine curing agent and imidazole curing agent was used as curing agent in the resin composition in the Reference Examples and Reference Comparative Examples.
As the amine curing agent, "KAYAHARD A-A (HDAA)" (3,3'-diethyl-4,4'-diaminodiphenylmethane), manufactured by Nippon Kayaku Co., Ltd., was used.
As the imidazole curing agent, "2P4MHZ-PW", manufactured by Shikoku Chemicals Corporation, was used.
(Formulation of the Epoxy Resin and Curing Agent)
Formulation of the epoxy resin and curing agent (total: 100% by weight) has 67.63% by weight of the epoxy resin, 25.61% by weight of the amine curing agent, and 6.76% by weight of the imidazole curing agent.
(Porous Carbon (Carbon Aerogel))
In the resin composition of the Reference Examples and Reference Comparative Examples, 5 parts by weight of the porous carbon relative to 100 parts by weight of the amount of the incorporated epoxy resin and curing agent was used.
(Other Components)
In the resin composition in the Reference Examples and Reference Comparative Examples, 0.50 part by weight of silane coupling agent (Shin-Etsu Silicone KBM-403, manufactured by Shin-Etsu Chemical Co., Ltd.) and 0.25 part by weight of dispersant (HIPLAAD ED-451, manufactured by Kusumoto Chemicals Ltd.) relative to 100 parts by weight of the amount of the incorporated epoxy resin and curing agent were used, addition to the epoxy resin, the curing agent, and the porous carbon.
Then, the epoxy resin, the curing agent, the porous carbon, the silane coupling agent, and the dispersant in the above-mentioned formulation were mixed by a planetary mixer, and further dispersed by a three-roll mill to form a paste, and a paste for forming a varistor element was produced.

Preparation of a Varistor Element

A substrate 12 having electrodes 14a and 14b in a comb-like form as shown in FIG. 1 was used. A multilayer printed wiring board (having a copper foil) with FR-4 as a material was used as the substrate 12. The copper foil of the multilayer printed wiring board was patterned to form electrodes 14a and 14b.

Then, as shown in FIG. 2, the above-produced resin composition in the Reference Examples and Reference Comparative Examples was screen-printed so as to cover electrodes 14a and 14b in a comb-like form formed on the surface of substrate 12, and the epoxy resin was cured to form a cured body 16. The epoxy resin was cured by maintaining the resin at a temperature of 165 degree C. for 2 hours. The all cured epoxy resin had a thickness of 90 μm. Thus, varistor elements in the Reference Examples and Reference Comparative Examples were prepared.

Measurement of Current-Voltage Characteristics of a Varistor Element and Determination of a Non-Linear Coefficient α

Current-voltage characteristics of the above-prepared varistor element in the Reference Examples and Reference Comparative Examples were measured. Specifically, current-voltage characteristics of the varistor element were measured by applying a predetermined voltage to a pair of electrodes (electrode 14a and electrode 14b) of the varistor element, and measuring a value of a current flowing the electrodes at that time.

Determination of a Non-Linear Coefficient α

The current-voltage characteristics of the varistor element can be approximated by $I=K \cdot V^\alpha$, wherein K is a constant and α is a non-linear coefficient. From the current-voltage characteristics of the varistor element, a non-linear coefficient α was determined by fitting. The results of the determination of non-linear coefficient α of the varistor elements in the Reference Examples and Reference Comparative Examples are shown in Tables 3 and 4. When a varistor element has a non-linear coefficient α of 6.5 or more, the varistor element is considered to have appropriate varistor characteristics that can be used as a varistor element.

As apparent from Tables 3 and 4, the non-linear coefficient α in all of Reference Examples 1 to 4 was 6.5 or more, and it is higher than the above described Comparative Examples 1 and 2. This result shows that a varistor element having appropriate varistor characteristics for using as a varistor element can be produced by using the resin composition comprising the porous carbon, in which the ratio ($I_D/I_G$) of accumulated intensity $I_G$ of a peak for G band and accumulated intensity $I_D$ of a peak for D band is 2.0 or more in a Raman spectrum of the porous carbon. Further, in the Raman spectra of the porous carbon in Reference Examples 1 to 4, the ratio ($M_D/M_G$) of maximum intensity $M_G$ of a peak for G band and maximum intensity $M_D$ of a peak for D band was 0.80 or more.

In contrast, the non-linear coefficient α was 2.2 or less in all of Reference Comparative Examples 1 to 5, and the varistor elements did not have appropriate varistor characteristics for using as a varistor element. Further, the ratio ($I_D/I_G$) of accumulated intensity $I_G$ of a peak for G band and accumulated intensity $I_D$ of a peak for D band of the porous carbon in Reference Comparative Examples 1 to 5 was less than 2. Further, with respect to the porous carbon in Reference Comparative Examples 1 to 5, the ratio ($M_D/M_G$) of maximum intensity $M_G$ of a peak for G band and maximum intensity $M_D$ of a peak for D band was less than 0.8.

As is apparent from the above, a varistor element having appropriate varistor characteristics for using as a varistor element can be obtained by using the resin composition comprising the porous carbon according to the embodiment with a predetermined Raman spectrum.

TABLE 3

| | | Reference Example 1 | Reference Example 2 | Reference Example 3 | Reference Example 4 |
|---|---|---|---|---|---|
| Materials for porous carbon (weight %) | Furfural | | 66.67 | 66.67 | 66.67 |
| | Phloroglucinol | | 33.33 | 33.33 | 33.33 |
| | Pyromellitic anhydride | 60.00 | | | |
| | Paraphenyldiamine | 25.71 | | | |
| | Pyridine | 4.26 | | | |
| | Acetic anhydride | 10.03 | | | |
| Production conditions | Initial concentration (weight %) | 12 | 10 | 4 | 20 |
| | Firing temperature (degree C.) | 1000 | 1000 | 1000 | 800 |
| Raman measurement | Accumulated peak intensity ratio ($I_D/I_G$) | 2.183 | 2.401 | 2.42 | 2.259 |
| | Maximum peak intensity ratio ($M_D/M_G$) | 0.959 | 1.034 | 1.104 | 0.992 |
| Non-linear coefficient (α value) | | 6.5 | 7.2 | 7.1 | 6.7 |

TABLE 4

| | | Reference Comparative Example 1 | Reference Comparative Example 2 | Reference Comparative Example 3 | Reference Comparative Example 4 | Reference Comparative Example 5 |
|---|---|---|---|---|---|---|
| Materials for porous carbon (weight %) | Furfural | 66.67 | 75.00 | 66.67 | 75.00 | |
| | Phloroglucinol | 33.33 | 25.00 | 33.33 | 25.00 | |
| | Pyromellitic anhydride | | | | | 60.00 |
| | Paraphenyldiamine | | | | | 25.71 |
| | Pyridine | | | | | 4.26 |
| | Acetic anhydride | | | | | 10.03 |
| Production conditions | Initial concentration (weight %) | 40 | 45 | 10 | 9 | 12 |
| | Firing temperature (degree C.) | 800 | 800 | 600 | 600 | 600 |
| Raman measurement | Accumulated peak intensity ratio ($I_D/I_G$) | 1.92 | 1.958 | 1.542 | 1.491 | 1.392 |
| | Maximum peak intensity ratio ($M_D/M_G$) | 0.7304 | 0.799 | 0.666 | 0.684 | 0.655 |
| Non-linear coefficient (α value) | | 2.0 | 2.2 | 1.8 | 1.9 | 2.0 |

DESCRIPTION OF REFERENCE NUMERALS

10: Varistor
12: Substrate
14a, 14b: Electrode
16: Cured body

The invention claimed is:

1. A low-voltage varistor comprising a cured body of a resin composition for forming the low-voltage varistor,
  wherein the resin composition for forming the low-voltage varistor comprises:
   (A) carbon nanotubes, or carbon nanotubes and carbon aerogel; and
   (B) at least one selected from epoxy resin and acrylic resin, and
  wherein a content of the carbon nanotubes in the resin composition is 0.01 to less than 0.05 parts by weight, based on 100 parts by weight of the component (B) and wherein a capacitance of the low-voltage varistor is 0.5 to 200 pF.

2. The low-voltage varistor according to claim 1, wherein a varistor voltage is 0.3 to 10 V when an inflow current of the low-voltage varistor is 0.1 mA.

3. The low-voltage varistor according to claim 1, wherein a non-linear coefficient of the low-voltage varistor α is 7 to 20 when a current-voltage characteristic of the low-voltage varistor is expressed by $I=KV^\alpha$, where V is an applied voltage, I is an inflow current, K is a constant, and α is the non-linear coefficient.

4. A circuit board equipped with the low-voltage varistor according to claim 1.

5. A semiconductor component package comprising the low-voltage varistor according to claim 1.

6. An interposer equipped with the low-voltage varistor according to claim 1.

7. A low-voltage varistor comprising a cured body of a resin composition for forming the low-voltage varistor,
  wherein the resin composition for forming the low-voltage varistor comprises:

(A) carbon aerogel; and (B) at least one selected from epoxy resin and acrylic resin and wherein a capacitance of the low-voltage varistor is 0.5 to 200 pF.

8. The low-voltage varistor according to claim 7, wherein a varistor voltage is 0.3 to 10 V when an inflow current of the low-voltage varistor is 0.1 mA.

9. The low-voltage varistor according to claim 7, wherein a non-linear coefficient of the low-voltage varistor α is 7 to 20 when a current-voltage characteristic of the low-voltage varistor is expressed by $I=KV^{\alpha}$, where V is an applied voltage, I is an inflow current, K is a constant, and α is the non-linear coefficient.

10. The low-voltage varistor according to claim 7, wherein a content of the carbon aerogel in the resin composition is 0.1 to 10 parts by weight based on 100 parts by weight of component (B).

11. The low-voltage varistor according to claim 7, wherein the carbon aerogel is porous carbon, and the porous carbon has an $I_D/I_G$ of 2.0 or more in a Raman spectrum measured by Raman spectroscopy, where $I_G$ is an accumulated intensity of a peak for G band around 1590 cm-1, and $I_D$ is an accumulated intensity of a peak for D band around 1350 cm-1.

12. The low-voltage varistor according to claim 11, wherein the carbon aerogel is porous carbon, and the porous carbon has an $M_D/M_G$ of 0.80 or more in a Raman spectrum measured by Raman spectroscopy, where $M_G$ is a maximum intensity of a peak for the G band, and $M_D$ is a maximum intensity of a peak for the D band.

13. A circuit board equipped with the low-voltage varistor according to claim 7.

14. A semiconductor component package comprising the low-voltage varistor according to claim 7.

15. An interposer equipped with the low-voltage varistor according to claim 7.

* * * * *